(12) United States Patent
Guo et al.

(10) Patent No.: US 7,722,950 B2
(45) Date of Patent: May 25, 2010

(54) ADHESIVE COMPOSITIONS FOR FLEXIBLE CIRCUIT MATERIALS, CIRCUITS, MULTI-LAYER CIRCUITS, AND METHODS OF MANUFACTURE THEREOF

(75) Inventors: David Guo, Pomfret Center, CT (US); Carlos L. Barton, Brooklyn, CT (US)

(73) Assignee: World Properties, Inc., Lincolnwood, IL (US)

( * ) Notice: Subject to any disclaimer, the term of this patent is extended or adjusted under 35 U.S.C. 154(b) by 502 days.

(21) Appl. No.: 11/559,637

(22) Filed: Nov. 14, 2006

(65) Prior Publication Data

US 2007/0116964 A1 May 24, 2007

Related U.S. Application Data

(60) Provisional application No. 60/736,644, filed on Nov. 14, 2005.

(51) Int. Cl.
*B32B 7/12* (2006.01)
(52) U.S. Cl. .................. 428/356; 428/209; 428/413; 428/414; 428/416; 428/418; 428/522; 174/259; 523/428; 523/434; 525/119; 525/122
(58) Field of Classification Search .......... 428/209, 428/356, 413, 414, 416, 418, 522; 156/60; 174/259; 523/428, 434; 525/107–108, 119, 525/122
See application file for complete search history.

(56) References Cited

U.S. PATENT DOCUMENTS

| | | | |
|---|---|---|---|
| 4,465,542 A | 8/1984 | Furihata | |
| 4,680,076 A | 7/1987 | Bard | |
| 4,743,644 A * | 5/1988 | Skipper et al. | 524/437 |
| 5,100,986 A * | 3/1992 | Favstritsky et al. | 526/293 |
| 5,260,130 A | 11/1993 | Sakaguchi et al. | |
| 5,807,910 A | 9/1998 | Tseng et al. | |
| 5,859,155 A | 1/1999 | Furihata et al. | |
| 6,054,509 A | 4/2000 | Arai et al. | |
| 6,620,513 B2 | 9/2003 | Yuyama et al. | |
| 6,709,741 B1 | 3/2004 | Lin et al. | |
| 6,998,011 B2 | 2/2006 | Schoenfeld et al. | |
| 7,201,957 B2 * | 4/2007 | Timberlake et al. | 428/297.4 |
| 7,202,311 B2 * | 4/2007 | Timberlake et al. | 525/480 |
| 2005/0019554 A1 | 1/2005 | Orikabe et al. | |
| 2006/0154078 A1 | 7/2006 | Watanabe et al. | |

FOREIGN PATENT DOCUMENTS

| | | |
|---|---|---|
| EP | 0087311 A1 | 8/1983 |
| EP | 1307077 A1 | 5/2003 |

OTHER PUBLICATIONS

International Search Report; International Application No. PCT/US2006/044234; Date of Mailing Apr. 2, 2007.
Written Opinion; International Application No. PCT/US2006/044234; Date of Mailing Apr. 2, 2007.

* cited by examiner

*Primary Examiner*—Cathy Lam
(74) *Attorney, Agent, or Firm*—Cantor Colburn LLP

(57) ABSTRACT

An adhesive for a circuit material, comprises a blend of a cure system; and a solid epoxy resin and a nitrile rubber functionalized with epoxy-reactive groups, wherein the solid epoxy resin and the nitrile rubber are reacted to form an adduct prior to blending with the cure system. The adhesive has low dendritic growth and improved solder resistance.

28 Claims, 5 Drawing Sheets

ADHESIVE COMPOSITIONS FOR FLEXIBLE CIRCUIT MATERIALS, CIRCUITS, MULTI-LAYER CIRCUITS, AND METHODS OF MANUFACTURE THEREOF

CROSS-REFERENCE TO RELATED APPLICATION

This application claims the benefit of U.S. Application Ser. No. 60/736,644, filed Nov. 14, 2005, which is incorporated by reference herein in its entirety.

BACKGROUND

This invention relates to adhesive materials useful in the formation of circuit materials, circuits, and multi-layer circuits.

As used herein, a circuit material is an article used in the manufacture of circuits and multi-layer circuits, and includes circuit laminates, bond plies, resin coated conductive layers, free films, and cover films. Circuit materials are formed from dielectric materials that can include thermosetting and thermoplastic polymers. The polymers may be combined with fillers such as silica to adjust the dielectric or other properties of the polymers. The adhesive layer in a circuit laminate, bond ply, build-up film, resin covered conductive layer, free film, or cover film is designed to soften or flow during manufacture of the circuit laminate or multi-layer circuit but not in use of the circuit. Dielectric substrate materials that are not reinforced with a fibrous web are often referred to as "flexible," and are used to make flexible (sometimes referred to as "flex") circuit materials and circuits. Flexible circuit materials are thinner, and are used in a wide variety of advanced electronic applications.

A circuit laminate is a type of circuit material that has a conductive layer fixedly bound to a dielectric substrate layer. Double clad laminates have two conductive layers, one on each side of the dielectric substrate. Patterning a conductive layer of a laminate, for example by etching, provides a circuit layer, and thus a circuit. Multi-layer circuits comprise a plurality of conductive layers, at least one of which contains a conductive wiring pattern. Typically, multi-layer circuits are formed by laminating one or more circuits together using bond plies, free films and, in some cases, adhesive-coated conductive layers, in proper alignment using heat and/or pressure. The bond plies or free films are used to provide adhesion between circuits and/or between a circuit and a conductive layer, or between two conductive layers. In place of a conductive layer bonded to a circuit with a bond ply, the multi-layer circuit may include a resin coated conductive layer bonded directly to the outer layer of a circuit. In such multi-layer structures, after lamination, known hole forming and plating technologies may be used to produce useful electrical pathways between conductive layers.

Epoxy-based adhesive systems are commonly used in circuit laminates, bond plies, free films, resin covered conductive layers, and cover films for flexible and rigid-flex circuits as well as for build-up layers in device packaging applications. Epoxy-based adhesive systems (hereinafter "epoxy adhesives") generally contain an epoxy resin, a nitrile rubber, one or more flame retardants, and small amounts of other resins, additives, and cure agents. Use of a rubber additive, in particular a nitrile rubber, is essential to provide both flexibility and sufficient bond to the copper conductive layers. Nitrile rubbers are copolymers of acrylonitrile and one or more conjugated diolefin monomers having 3 to 5 carbon atoms, for example 1,3-butadiene, isoprene, 1,3-pentadiene and the like. Nitrile rubbers are preferred because they have excellent compatibility with epoxy, as well as other beneficial properties such as good thermal and chemical resistance, high polarity, and the like. The nitrile rubbers often have functional terminal groups, including carboxyl terminations (CTBN), amine terminations (ATBN), and epoxy terminations (ETBN), to allow crosslinking with the epoxy, thereby providing enhanced thermal and chemical resistance.

High molecular weight grade rubbers (such as Nipol 1072 from Zeon Chemicals) are preferred because the lower flow prevents displacement from the stack ("squeezing out") during the lamination process. However, it has been found by the inventors hereof that the combination of epoxy resin and nitrile rubber leads to certain problems associated with manufacture and use of the circuit materials and the circuits produced therefrom. One such problem is the potential for dendritic growth to occur under DC (direct current) bias at elevated temperature and humidity levels. Minimizing such dendritic growth would provide flexible circuit materials, circuits, and multi-layer circuits with even greater stability under conditions of high heat and humidity.

Another drawback of current epoxy adhesives used for flex circuits is their relatively short shelf life. During storage over time the flow characteristics of the partially cured ("B-staged") epoxy adhesive changes. This requires circuit fabricators to manage their inventory of materials carefully. One of the primary causes of the short shelf life is reaction between the carboxyl group on the high molecular weight nitrile rubber and the epoxy resins. This reaction occurs slowly at room temperature, but because of the high molecular weight of the rubber, even a small number of crosslinks will significantly reduce flow of the adhesive, which can cause problems during circuit fabrication. Extending the shelf life of the adhesive by eliminating the epoxy-carboxyl reaction in the adhesive would greatly enhance the usefulness of the products made using this adhesive.

In addition, the worldwide trend to eliminate hazardous materials in the construction of electronic devices has necessitated the removal of lead (Pb) from solder. The Pb-free solders currently in use melt at temperatures 30 to 40° C. higher than the standard tin-lead (Sn—Pb) solder they replace. Actual Pb-free solder reflow processes expose the circuits to temperatures as high as 260° C., and material qualification testing often stresses the materials at 288° C. Increasing the ability of the material systems to survive the higher temperature processes requires an adhesive with superior thermal resistance.

There accordingly remains a need in the art for epoxy adhesive systems for flexible circuits that have one or more of lower dendritic growth under conditions of high heat and humidity, are capable of surviving thermal exposures required for Pb-free solder processes, and/or are more stable as a b-staged adhesive. All of these attributes are preferably present without comprising the other advantageous properties of the epoxy systems, such as good adhesion and good processability.

BRIEF SUMMARY

The above-described drawbacks and disadvantages are alleviated by an adhesive circuit material comprising an adduct of a solid epoxy resin and a nitrile rubber, and a cure system. The adhesive composition further preferably comprises an epoxy resin and a non-halogenated flame retardant. The adhesive composition further optionally comprises an inorganic filler and/or a vulcanizing agent for the nitrile rubber and/or other additives for improving the properties of the adhesive. The circuit material can be in the form of an unsupported B-staged adhesive film (free film) protected by disposable release films; a bond ply comprising a B-staged adhesive deposited on both sides of polymeric dielectric film; a cover film comprising a B-staged adhesive layer on one side of a dielectric film such as a polyimide film; or an adhesive-coated conductive layer.

In another embodiment, a circuit material is a single clad laminate for use in the fabrication of electronic circuits, the laminate comprising an adhesive layer disposed between a polymeric dielectric film and a conductive layer, wherein the adhesive layer comprises an adduct of a solid epoxy resin and a nitrile rubber, and a cure system.

In another embodiment, the circuit material is a double clad laminate for use in the fabrication of electronic circuits, the laminate comprising a first adhesive layer disposed between a first side of a polymeric dielectric film and a first conductive layer, and a second adhesive layer disposed between a second side of the dielectric film and a second conductive layer, wherein the adhesive layer comprises an adduct of a solid epoxy resin and a nitrile rubber, and a cure system.

In still another embodiment, a circuit comprises an adhesive layer, a circuitized conductive layer disposed on a dielectric layer, and, wherein the adhesive layer comprises herein the adhesive layer comprises an adduct of a solid epoxy resin and a nitrile rubber, and a cure system.

In still another embodiment, a circuit comprises a circuitized conductive layer disposed on a dielectric layer, and an adhesive layer, wherein the adhesive layer comprises an adduct of an epoxy resin and a nitrile rubber, and a cure system. On top of the circuitized layer a coverfilm (also known as a "coverlayer") is applied as a protective and insulation layer. The coverfilm is comprised of a polymeric dielectric layer such as a polyimide film and a B-staged adhesive wherein the adhesive layer comprises an adduct of a solid epoxy resin and a nitrile rubber, and a cure system. The coverfilm is applied with the adhesive layer disposed against conductive layer and with the dielectric layer on the outside.

In still another embodiment, the circuit comprising a coverfilm as above is made into a multilayer stack of circuits, comprising a plurality of circuitized and interconnected layers, by interposing free film adhesive layers or bond plies between the individual protected circuitized layers. One or all of the adhesive layers comprises an adduct of a solid epoxy resin and a liquid nitrile rubber, and a cure system.

The above discussed and other features and advantages will be appreciated and understood by those skilled in the art from the following detailed description and drawings.

BRIEF DESCRIPTION OF DRAWINGS

Referring now to the exemplary drawings wherein like elements are numbered alike in the several FIGURES.

DETAILED DESCRIPTION

Figure 1A:
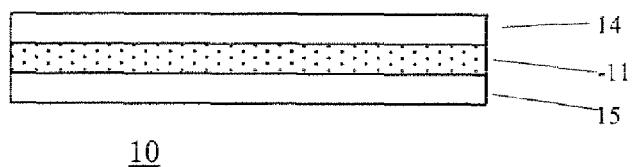
FIGS. 1A to 1E are schematic representations of exemplary circuit materials comprising an adhesive in accordance with the present invention.

The inventors hereof have unexpectedly found that epoxy adhesive materials with low dendritic growth, excellent temperature resistance, good flow and fill properties, longer shelf life, and excellent physical and electrical properties can be obtained using an adduct of a solid epoxy resin and a nitrile rubber functionalized with groups reactive with the epoxy resin. As used herein, an "adduct" refers to a pre-reacted product. For example, an adduct of an epoxy resin and a nitrile rubber functionalized with groups reactive with the epoxy resin refers to the product obtained by pre-reacting the epoxy resin with the nitrile rubber prior to addition to the other components of the epoxy adhesive compositions. Use of a solid epoxy compound to form the adduct provides a good balance between the flow and non-tacky properties of the adhesive composition. Such epoxy adhesive compositions enable the production of flame retardant circuit materials having excellent stability under conditions of high heat and humidity, as well as good processability.

The epoxy adhesive composition is a uniform blend that comprises, at minimum, an adduct of an epoxy resin and a functional group-containing nitriTe rubber as described in further detail below; and a curing system comprising a cuing agent and a curing accelerator. The adhesive composition further preferably comprises an epoxy resin and a non-halogenated flame retardant. The adhesive composition can further optionally comprise an inorganic filler and/or a vulcanizing agent for the nitrile rubber and/or other additives.

Suitable epoxy resins for the formation of the epoxy-nitrile rubber adduct are polyfunctional epoxy resins having at least two epoxy groups per molecule. Examples of suitable epoxy resins include bisphenol A epoxy resins, bisphenol F epoxy resins, novolac epoxy resins, glycidylamine epoxy resins, and the like. While the preferred embodiment herein is halogen-free, it is possible to use a halogenated or, in particular, a brominated epoxy resin, or a combination of a non-halogenated epoxy resin and a halogenated epoxy resin. A specific epoxy is a copolymer of epichlorohydrin and bisphenol-A. It is advantageous to use solid epoxy resins for the formation of the epoxy-nitrile rubber adduct. Adducts made using liquid epoxies produce adhesives that are tacky and flow excessively when used at high concentrations (greater than about 25% by weight) in the adhesive.

The nitrile rubber used to form the adduct is functionalized to provide reactivity with the epoxy residues in the epoxy resin. Suitable functional groups include, for example, amino groups and/or carboxylate groups. In an embodiment, carboxylate groups are used. The functional groups can be introduced to the nitrile rubber during polymerization of thereof, by adding functional group-containing monomers to the polymerization mixture, or by modification of terminal groups of the rubber by means such as oxidation. Suitable functional-group containing monomers include carboxylic acid terminated monomers such as, for example, acrylic acid, methacrylic acid, maleic acid, fumaric acid, itaconic acid, or a combination comprising at least one of the foregoing monomers.

The nitrile rubbers can be prepared by solution or emulsion radical polymerization. In one embodiment, the rubbers are prepared by a method that minimizes the ionic content of the rubber, preferably solution polymerization. Such rubbers are often of lower molecular weight, and are thus liquid. A preferred nitrile rubber is a carboxy-terminal liquid nitrile rubber having a low ionic content.

The adduct of the epoxy resin and functional group-containing nitrile rubber can be obtained by combining the epoxy resin and rubber, optionally in the presence of a catalyst, and heating the composition to provide the adduct, wherein the ratio of epoxy groups is in excess to the functional groups on the rubber. The ratio of epoxy groups and functional groups, reaction time, and conditions is adjusted so as to provide an adduct wherein most (greater than 50%, greater than 75%, greater than 90%, or greater than 95% of the functional groups are reacted, while minimizing increase in molecular weight by the formation of crosslinks. The amount of nitrile rubber in the adduct is selected to provide the appropriate ratio of epoxy groups to epoxy-reactive functional groups, and to provide the desired properties to the adhesive. The rubber content of the adhesive can be about 10 to about 60 wt. % of the adduct, specifically about 25 to about 45 wt. %. A suitable adduct having an elastomer content of 32 wt % is prepared from solid bisphenol-A epoxy resin and a carboxy terminated butadiene-acrylonitrile elastomer, and is available under the trade name HYPOX® RK84, from CVC Specialty Chemicals Inc.

Without being bound by theory, it is believed that under hot and humid conditions, electrically biased, closely spaced conductors can act like an electrolytic plating cell. Over a period time, copper ions are produced at the anode and transported by the electric field to the cathode where they are reduced to copper metal and plate out. This problem is readily observed in photomicrographs. Factors that determine whether the material will exhibit dendritic growth and the rate at which dendritic growth will progress include adhesive/dielectric material composition, conductor spacing, bias voltage, temperature, humidity level, and the like. Further without being bound by theory, solid adducts as described above have a lower ionic content than the high molecular weight nitrile rubbers, particularly carboxylated nitrile butyl rubbers, ordinarily used in epoxy adhesive compositions. Again without being bound by theory, it is believed that high molecular weight carboxylated nitrile rubbers have a higher ionic content because they are produced by emulsion polymerization, and the residual ionic contaminants increase dendritic growth. It may be that use of the above described adducts lowers the ionic content of the adhesives, leading to a different morphology in the adhesive, and thus to lower dendritic growth under conditions of high heat and high humidity. Use of an adhesive comprising an epoxy resin and a liquid nitrile rubber having a low ionic content (and no adduct) is possible, but such materials render the adhesive too flowable during lamination. It is unexpected that low dendritic growth and good processability can be achieved using epoxy-liquid nitrile rubber adducts without significantly adversely affecting the other desirable properties of the adhesives, such as bond strength to copper, solderability, and flame retardance.

The adhesive composition further comprises a cure system. The cure system comprises a curing agent for the epoxy resin, which can be selected from various known compounds used for cure of epoxy resins, including aliphatic amine compounds, aromatic amine compounds, acid anhydride compounds, dicyandiamide, complexes of boron trifluoride and an amine compound, phenolic and novolac resins, and the like. The curing agents can be used either singly or as a combination of two kinds. 4,4'-Diamino diphenyl sulfone (DDS) and 4,4'-diamino diphenyl methane (DDM) can be specifically mentioned. The curing agent is present in an amount of about 2 to about 20 parts by weight, preferably, about 5 to about 15 parts by weight per 100 parts by weight of the epoxy resin.

The curing accelerator can be selected from the group consisting of imidazole compounds such as 2-alkyl-4-methyl imidazole compounds, 2-alkyl-4-ethyl imidazole compounds, 2-phenyl imidazole compounds and the like, metal borofluoride compounds such as tin borofluoride, zinc borofluoride and the like, and metal octoate compounds such as tin octoate, zinc octoate and the like. These various curing accelerator compounds can be used either singly or as a combination. In particular, borofluoride compounds and metal octoate compounds are preferred because these curing accelerators give an adhesive composition having good storage stability and easy controllability of the flowability behavior. The amount of curing accelerator is about 0.1 to about 3 parts by weight, preferably about 0.3 to about 1.5 parts by weight per 100 parts by weight of the epoxy resin.

In a preferred embodiment, the adhesive further comprises an epoxy resin that is not in the form of an adduct. Suitable epoxy resins are as described above. Exemplary non-halogenated epoxy resin products available on the market include those sold under the trade name EPIKOTE 828, 1001, 152 and 154 (each a product by Yuka Shell Epoxy Co.), ECON 102S, 103S and 104S (each a product by Nippon Kayaku Co.) and others. Again, non-halogenated epoxy resins are preferred, but halogenated epoxies can be used. Various commercial grades of brominated epoxy resin products are available on the market, including those sold under the trade names of EPIKOTE 5050, 5049, 5048 and 5045 containing about 49%, 26%, 25% and 19% by weight, respectively, of bromine (each a product by Yuka Shell Epoxy Co.), BREN-S containing about 35% by weight of bromine (a product by Nippon Kayaku Co.) and others. Combinations of different epoxy resins can be used.

The adhesive composition further preferably comprises a non-halogenated flame retardant, for example a metal oxide or hydroxide such as aluminum hydroxide, magnesium hydroxide, and aluminum oxide. To improve adhesion between the fillers and polymer, the filler can be treated with one or more coupling agents, such as silanes, zirconates, or titanates. The metal oxide or hydroxide can have an average particle diameter not exceeding 5 micrometers, preferably, not exceeding 1 micrometer, and be present in an amount of about 1 to about 50 parts by weight, preferably about 25 to 40 parts by weight, per 100 parts by weight of the epoxy resin.

Other suitable flame retardants include various organic phosphorous-based compounds, for example an aromatic phosphate of the formula $(GO)_3P=O$, wherein each G is independently an $C_{1-36}$ alkyl, cycloalkyl, aryl, alkylaryl, or arylalkyl group, provided that at least one G is an aromatic group. Two of the G groups can be joined together to provide a cyclic group, for example, diphenyl pentaerythritol diphosphate. Other suitable aromatic phosphates can be, for example, phenyl bis(dodecyl) phosphate, phenyl bis(neopentyl) phosphate, phenyl bis(3,5,5'-trimethylhexyl) phosphate, ethyl diphenyl phosphate, 2-ethylhexyl di(p-tolyl) phosphate, bis(2-ethylhexyl) p-tolyl phosphate, tritolyl phosphate, bis(2-ethylhexyl) phenyl phosphate, tri(nonylphenyl) phosphate, bis(dodecyl) p-tolyl phosphate, dibutyl phenyl phosphate, 2-chloroethyl diphenyl phosphate, p-tolyl bis(2,5,5'-trimethylhexyl) phosphate, 2-ethylhexyl diphenyl phosphate, or the like. A specific aromatic phosphate is one in which each G is aromatic, for example, triphenyl phosphate, tricresyl phosphate, isopropylated triphenyl phosphate, and the like. Examples of suitable di- or polyfunctional aromatic phosphorus-containing compounds include resorcinol tetraphenyl diphosphate (RDP), the bis(diphenyl) phosphate of hydroquinone and the bis(diphenyl) phosphate of bisphenol-A, respectively, their oligomeric and polymeric counterparts, and the like. Metal phosphinate salts can also be used. Examples of phosphinates are phosphinate salts such as for example alicylic phosphinate salts and phosphinate esters. Further examples of phosphinates are diphosphinic acids, dimethylphosphinic acid, ethylmethylphosphinic acid, diethylphosphinic acid, and the salts of these acids, such as for example the aluminum salts and the zinc salts. Examples of phosphine oxides are isobutylbis(hydroxyalkyl) phosphine oxide and 1,4-diisobutylene-2,3,5,6-tetrahydroxy-1,4-diphosphine oxide or 1,4-diisobutylene-1,4-diphosphoryl-2, 3-5,6-tetrahydroxycyclohexane. Further examples of phosphorus-containing compounds are NH1197® (Great Lakes), NH1511® (Great Lakes), NcendX P-30® (Albemarle), Hostaflam OP5500® (Clariant), Hostaflam OP910® (Clariant), EXOLIT 935 (Clariant), and Cyagard RF 1204®, Cyagard RF 1241® and Cyagard RF 1243® (Cyagard are products of Cytec Industries). In a particularly advantageous embodiment, a halogen-free version of the adhesive has excellent flame retardance when used with EXOLIT 935 (an aluminum phosphinate).

Other exemplary suitable flame retardant compounds containing phosphorus-nitrogen bonds include phosphonitrilic chloride, phosphorus ester amides, phosphoric acid amides, phosphonic acid amides, phosphinic acid amides, and tris (aziridinyl) phosphine oxide. When present, the flame retardant is generally used in amounts of about 1 to about 25 parts by weight, more specifically about 10 to about 20 parts by weight, based on 100 parts by weight of epoxy-nitrile rubber adduct.

The adhesive can optionally comprise one or more other dielectric particulate fillers. Useful particulate fillers include, but are not limited to, titanium dioxide (rutile and anatase), barium titanate, strontium titanate, silica (particles and hollow spheres) including fused amorphous silica and fumed silica; other hollow ceramic spheres, corundum, wollastonite, aramide fibers (e.g., KEVLAR from DuPont), fiberglass, $Ba_2Ti_9O_{20}$, glass spheres, quartz, boron nitride, aluminum nitride, silicon carbide, beryllia, alumina, and magnesia. The particulate fillers can be used alone or in combination. Particularly useful particulate fillers are rutile titanium dioxide and amorphous silica because these fillers have a high and low dielectric constants, respectively, thereby permitting a broad range of dielectric constants combined with a low dissipation factor to be achieved in the final product by adjusting the respective amounts of the two fillers in the composition. To improve adhesion between the fillers and polymer, the filler can be treated with one or more coupling agents, such as silanes, zirconates, or titanates. The total amount of dielectric particulate filler, when present, is generally about 0.1 to about 50 parts by weight (pbw) per 100 pbw of the epoxy resin. Specific amounts are about 0.5 to about 25 pbw, and even more specifically about 1 to about 10 pbw per 100 pbw of the epoxy resin.

The adhesive composition can optionally be compounded with a vulcanizing agent, for example sulfur, zinc oxide, magnesium oxide, and the like either singly or as a combination. The amount of the vulcanizing agent is about 0.2 to about 10 parts by weight, preferably about 1 to about 5 parts by weight per 100 parts by weight of the epoxy-nitrile rubber adduct.

Other additives can optionally be present in the adhesive compositions, for example other resins, antioxidants, thermal stabilizers, colorants, UV absorbers, and the like. The amount of such additive will vary depending on their function, and can be, for example, about 0.1 to about 10 parts by weight per 100 parts by weight of the epoxy-nitrile rubber adduct. It has been found that an antioxidant will aid in increasing the thermal stability of the adhesive compositions.

The relative amounts of the adduct, optional epoxy resin, and other components are selected so as to provide the desired properties in the adhesive composition, for example flow, thermal resistance, electrical properties, non-tackiness of B-staged adhesive layers, toughness of the B-staged and the fully cured adhesive layer, and like considerations. In one embodiment, the adduct of the solid epoxy resin is the only epoxy component in the adhesive composition.

In another embodiment, the adhesive composition consists essentially of the adduct, or the adduct and epoxy resin, for example a bisphenol A epoxy resin or a novolac epoxy resin. In the latter embodiment, the adhesive composition consists essentially of 40 to 99 parts by weight (pbw), specifically 55 to 85 pbw, more specifically 50 to 70 pbw of adduct, and 1 to 35 pbw, specifically 10 to 30 pbw, more specifically 15 to 25 pbw of epoxy resin, each based on the total weight of the composition, with the remainder being other additives such as flame retardants.

In still another embodiment, the adduct is used together with a small amount of a high molecular weight carboxy-functionalized nitrile rubber, in order to improve the toughness of the compositions, and optionally an epoxy resin. In this embodiment, the adhesive composition comprises 40 to 99 pbw, specifically 55 to 85 pbw, more specifically 50 to 70 pbw of adduct; 1 to 20 pbw, specifically 5 to 15 pbw, more specifically 8 to 12 pbw of carboxylated nitrile rubber; and 0 to 30 pbw, specifically 5 to 25 pbw, more specifically 10 to 20 pbw of epoxy resin, ach based on the total weight of the composition, with the remainder being other additives such as flame retardants.

As previously stated, the epoxy adhesive is useful as a dielectric material for the formation of circuit materials such as circuit laminates, bond plies, cover films, and adhesive-coated conductive layers, all of which can be used to form circuits and multi-layer circuits. It is contemplated that polymeric dielectric materials comprising polymers other than those disclosed herein can be used in combination with the adhesives to form circuit materials, circuits and multi-layer circuits. Other suitable dielectric polymers include, for example, those based on epoxy, polybutadiene, polyisoprene, liquid crystalline polyesters, polytetrafluoroethylene, polyimide, polyphenylene oxide, polyethylene terephthalate, polybutylene terephthalate resins, poly(parabanic acid), polyether ether ketone resins, poly(phenylene sulfide) resins, aramid resins, and the like. Polyimide layers are of particular utility.

In use, the components of the adhesive composition are combined to form an intimate blend in a suitable solvent such as methylethyl ketone. The relative amount of adhesive composition and solvent is selected to provide a coatable mixture, preferably using a minimum amount of solvent. The mixing temperature is regulated to avoid substantial decomposition, crosslinking, or other reaction of the components. Mixing continues until all components are uniformly dispersed throughout the composition. Any particulate filler can be pretreated with silanes in a separate step for more efficient use of the agents. Optionally, silanes can be included in the slurry.

The blend can be cast or coated to form a layer by methods known in the art, followed by evaporation of the solvent (drying). Partial curing (B-staging) can occur during the drying step. The thickness of the layer will depend on the desired application, and can be, for example, about 1 to about 100 micrometers, more specifically about 5 to about 50 micrometers. The layer can be formed on a release layer, or coated directly onto a conductive layer or other polymeric dielectric layer.

Suitable release layers include, for example, polyethylene, polypropylene, TPX resins, polyethylene terephthalate resins, and the like coated, for example, with a silicone-based releasing agent, as well as paper sheets coated with a polyethylene, polypropylene or TPX resin.

Useful conductive layers for the formation of circuit materials, circuits, and multi-layer circuits include stainless steel, copper, aluminum, zinc, iron, transition metals, and alloys comprising at least one of the foregoing with copper specifically useful. There are no particular limitations regarding the thickness of the conductive layer, nor are there any limitations as to the shape, size or texture of the surface of the conductive layer. Specifically however, the conductive layer has a thickness of about 3 micrometers to about 200 micrometers, with about 9 micrometers to about 180 micrometers especially useful. When two or more conductive layers are present, the thickness of the two layers can be the same or different.

Copper conductive layers are especially useful. The copper conductive layer can be treated to increase surface area, treated with a stabilizer to prevent oxidation of the conductive layer (i.e., stainproofing), or treated to form a thermal barrier. Such copper conductive layers are available from, for example, Nikko Corporation, from Olin Corporation, from Co-Tech under the trade names "TWX", "TW", and "TAX"; from Oak-Mitsui under the trade name "TOB"; from Circuit Foil Luxembourg under the trade name "TWS"; from Gould Electronics under the trade name "JTCS"; and from Chang Chun Petrochemical Company under the trade name "PINK".

Exemplary embodiments of circuit materials in accordance with the present invention are shown in FIGS. 1A to 1E. In FIG. 1A, a free film 10 comprises a layer 11 of a B-staged adhesive comprising the epoxy-nitrile rubber adduct, disposed between two release layers 14, 15. As used herein, "disposed" includes layers that partially or wholly cover each other.

Figure 1B:
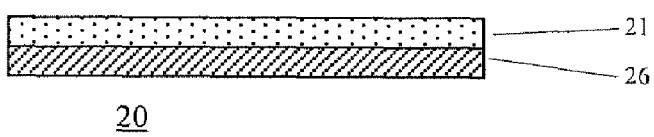

An exemplary cover film 20 is shown in FIG. 1B, and comprises a B-staged adhesive 21 disposed on a dielectric film 26, for example a polyimide film.

Figure 1C:
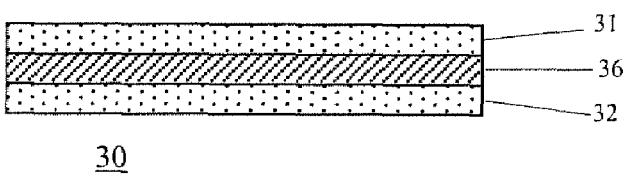

An exemplary bond ply 30 is shown in FIG. 1C, and comprises a first layer 31 of B-staged adhesive comprising an epoxy-nitrile rubber adduct on a first side of polymeric dielectric film 36, and a second layer 32 of an adhesive comprising the epoxy-nitrile rubber adduct.

For example, in the preparation of a bond ply, free film, or cover film, or adhesive-coated conductive layer, a release layer, a polymeric dielectric layer, or a conductive layer, respectively, is uniformly coated with the adhesive composition in the form of a flowable liquid having an appropriate viscosity by using, for example, a reverse roll coating machine, followed by a heat treatment to remove the solvent and partially cure the film. Heat treatment can be by passing the layer through an in-line driving oven at a temperature of about 40 to 160° C., over about 2 to about 20 minutes. For a free film, bond ply, cover film or adhesive-coated conductive layer, a release film can be applied and bonded to the surface of the adhesive layer by passing the three-layer structure together through a heating roller at a temperature of about 20 to about 160° C., using a linear pressure of about 0.2 to about 20 kg/cm.

Figure 1D:
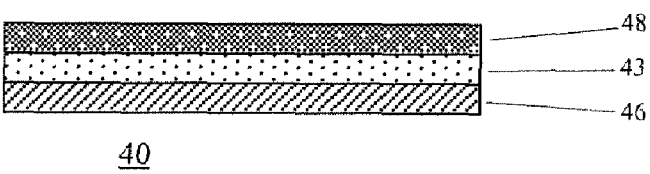

FIG. 1D is a schematic diagram showing a single clad laminate 40, comprising a conductive layer 48 (for example, a copper foil) disposed on a cured adhesive layer 43 comprising an epoxy-nitrile adduct. A polymeric dielectric film 46 is disposed on a side of cured adhesive layer 43 opposite to conductive layer 48.

Figure 1E:
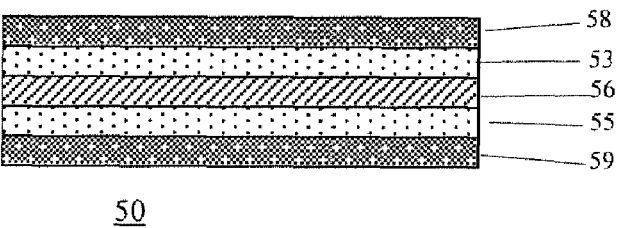

FIG. 1E shows a double clad laminate 50. A first cured adhesive layer 53 is disposed between a first conductive layer 58 and a first side of a dielectric film 56. A second cured adhesive layer 55 is disposed between second conductive layer 59 and a second side of dielectric film 56. At least one, preferably both cured adhesive layers 53, 55 comprise the epoxy-nitrile rubber adduct.

For the manufacture of a single clad laminate, a polymeric dielectric film (such as a polyimide film) is uniformly coated with the adhesive composition in the form of a flowable liquid having an appropriate viscosity by using, for example, a reverse roll coating machine, followed by a heat treatment to remove the solvent and partially cure the film. Heat treatment can be effected by passing the layer through an in-line drying oven at a temperature of about 40 to 160° C., over about 2 to about 20 minutes. After drying, a conductive layer, such as a metal foil, is applied and bonded to the surface of the adhesive layer by passing the three-layer structure together through a heating roller at a temperature of about 20 to about 160° C., using a linear pressure of about 0.2 to about 20 kg/cm. Subsequently, the three layer laminated structure can be cured by placing the material in a heated oven or a heated hydraulic press for a time effective to fully cure the adhesive. The time and temperature used for curing the adhesive will depend on the adhesive composition, the specific curing system employed, and the desired final properties of the product. A typical curing cycle is one hour at 125° C. followed by 1 to 2 hours at 175° C.

To make a double clad laminate, a second adhesive layer is applied to the previously uncoated side of the polymeric dielectric film after adhering the first conductive layer. This second adhesive layer is dried and a second conductive layer is applied and bonded by passing the five-layer structure between heated rolls. The five-layer laminated structure of the double clad laminate is then cured in a heated oven or heated hydraulic press for about one hour at 125° C. followed by 1 to 2 hours at 175° C.

Figure 2:
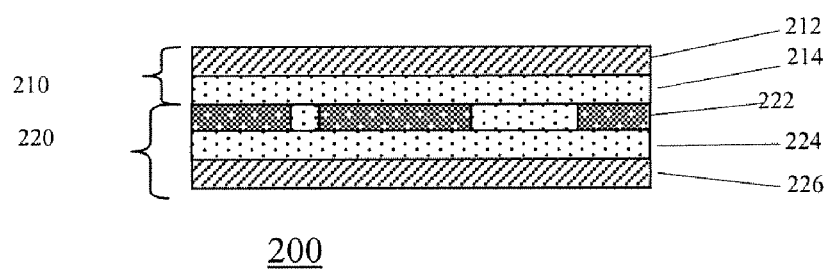
FIG. 2 is a schematic representation of an exemplary circuit comprising an adhesive in accordance with the present invention.

FIG. 2 shows an exemplary single clad circuit material 200' comprising a cover film 210 and a partially circuitized single clad laminate 220. Cover film 210 comprises a dielectric film 212 and a first cured adhesive layer 214. Partially circuitized single clad laminate 220 comprises a circuitized conductive layer 222, a second cured adhesive layer 224, and a dielectric film 226. First cured adhesive layer 214 is disposed on circuitized conductive layer 222. At least one, preferably both, cured adhesive layers 214, 224 comprise the epoxy-nitrile rubber adduct.

Figure 3:
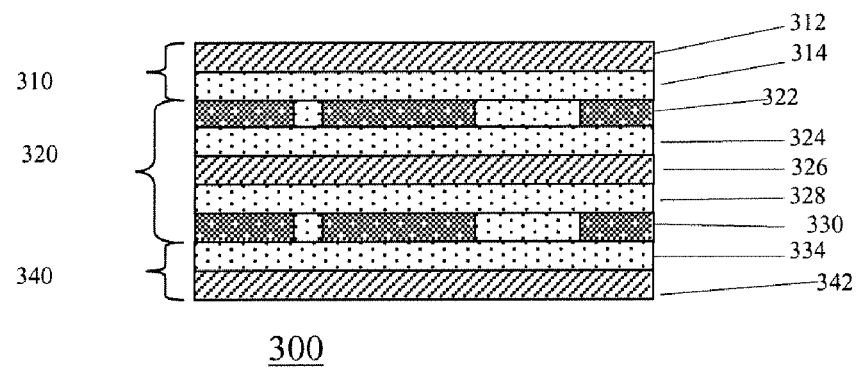
FIG. 3 is a schematic representation of an exemplary multilayer circuit comprising an adhesive and two conductive layers.

Multi-layer circuit structures can be made by using free film or bond plies to bond multiple layers of the structures above into a single stacked circuit containing many circuitized conductive layers. FIG. 3 shows an exemplary multi-layer circuit 300 comprising a first cover film 310 disposed on a first side of a partially circuitized double clad laminate 320, and a second cover film 340 disposed on a second side of double clad laminate 320. First cover film 310 comprises a first dielectric film 312 and a first cured adhesive layer 314, and second coverfilm 340 comprises a second dielectric film 342 and a second cured adhesive layer 334. Double clad circuit 320 comprises a dielectric film 326 adhered to a first partially circuitized conductive layer 322 by a third cured adhesive layer 324, and adhered on the opposite side thereof of to a second partially circuitized conductive layer 328 by a fourth cured adhesive layer 328. At least one, and preferably all of adhesive layers 314, 324, 328, 334 comprise the epoxy-nitrile rubber adduct.

The adhesive material as described above has properties that are advantageous for use as an adhesive material in flexible circuits, including good processability. It has a high Tg (greater than about 85° C.), a broad lamination window, and excellent flow, but minimum squeeze out during lamination. In particular, the adhesives have adequate flow to fill between small circuit features void-free, yet not so much flow that "squeeze-out" of the coverfilm adhesive into pad openings occurs. If the connection pads are covered with squeezed-out adhesive, solder will not adhere. Excessive squeeze-out means an additional cleaning step in the process. Excessive squeeze-out is a cause for material rejection at the fabricator. In a particularly advantageous feature higher flow is achieved using the solid adducts without sacrificing the tack-free characteristics of the B-staged adhesive film.

Bond strength to copper is also high, for example on the order of about 8 pli.

Thermal performance of the adhesive composition is also improved. For example, the adhesive passes a 288° C. solder test for over ten minutes. Further, as illustrated in the examples below, thermogravimetric analysis (TGA) can be used as an indicator of thermal stability. Without being bound by theory, weight loss observed during a TGA sweep (e.g., from room temperature to 500° C. in air at a rate of 10° C. per minute) is an indication of volatile release either due to remaining solvent (at lower temperature) or decomposition (at higher temperature). Lower weight loss at a given temperature can therefore be an indication that an adhesive is more thermally stable. The inventive examples show less weight loss than adhesives that do not contain the above described adduct.

The adhesive also shows no dendritic growth, when tested at 85° C., 85% relative humidity, and 50V over a 240-hour test window with a 3 mil space between conductors.

It has further been found that the adhesive has an improved shelf life compared to epoxy adhesives that do not contain the above described adduct. Shelf life in one embodiment refers to the amount of time after manufacture of the B-staged coverfilm or freefilm that the product can be used successfully by the fabricator with the fabricator modifying the lamination conditions. The high molecular weight carboxylated nitrile rubber based adhesives all have relatively short shelf-life when stored at room conditions. For example, many commercially available adhesives stipulate that shelf-life is 90 days when stored at less than 4° C. At ambient storage conditions (as high as 35° C. in southeast Asia) shelf-life is measured in weeks. This is a serious problem for both the material manufacturer and the circuit fabricator. As the adhesive ages, there may be a decrease in adhesive strength and/or a decrease in flow that prevents adequate fill between circuit features. With the adhesive described herein, there is less increase in flow upon storage, for example for one month, two months, or even three months at 23° C., compared to current commercially available epoxy adhesive materials. Bond strength is also approximately the same after one month, two months, or even three months at 23° C.

The invention is illustrated by the following non-limiting examples.

EXAMPLE

Copper foil used for preparing laminates is ½ ounce per square foot (oz./ft$^2$), black-treated rolled copper foil obtained from Nikko Corporation.

Example 1

An adhesive was prepared according to the formulation in Table 1 below by mixing the components in sufficient methyl ethyl ketone (MEK) to give an adhesive solution that contains 60% MEK by weight.

TABLE 1

| Component/Trade name | Description | Amount, pbw |
|---|---|---|
| HYPOX RK-84 | Epoxy/CTBN adduct (CVC Specialty Chemicals Inc.) | 60 |
| Nipol 1072 | CTBN (Zeon Chemicals) | 10 |
| DER 684-EK40 | Bisphenol A-based epoxy resin (Dow) | 15 |
| DER 664 | Bisphenol A-based epoxy resin (Dow) | 5 |
| EPON 164 | Epoxy novolac resin (Hexion) | 5 |
| Irganox 565 | Antioxidant (Ciba Specialty Chemicals) | 0.3 |
| Irganox 1010 | Antioxidant (Ciba Specialty Chemicals) | 0.15 |
| EXOLIT OP 935 | Phosphinate flame retardant (Clariant) | 18 |
| Hymod M9400SP | Alumina trihydrate flame retardant (JM Huber) | 5 |
| SIG5840 | Glycidoxypropyltrimethoxysilane (Gelest, Inc.) | 0.1 |
| 2-Methylimidazole | Curing accelerator | 0.2 |
| Dicyandiamide | Curing agent | 1 |

The adhesive was coated onto 12.5 thick micrometer Apical NP polyimide film at a thickness that when dried produced an adhesive film thickness of 15 micrometer. Copper foil was laminated to the adhesive side of the coated polyimide film by passing the material through a set of heated pressure rolls. The non-coated side of the polyimide was then coated with another layer of adhesive and copper laminated to the second side of the polyimide in a manner similar to the first side. This double clad laminate was then cured in an autoclave under a nitrogen pressure of 270 psi for 1 hour at 107° C. followed by an additional 2 hours at 160° C. The autoclave was cooled and the pressure reduced to ambient pressure before removing the double clad copper laminate from the autoclave.

The laminate was tested according to IPC methods for flexible circuit materials. The results of the testing are listed in table 2 below.

TABLE 2

| | |
|---|---|
| Peel strength as made | 7.4-8.5 pli |
| Peel strength after 10 sec in 288° C. solder | 7.8-8.5 pli |
| Solder float resistance in 288° C. solder | >10 min. without change |
| Dimensional stability, method B | |
| MD | <+/−0.05% |
| TD | <+/−0.05% |

TABLE 2-continued

Dimensional stability, method C

| | |
|---|---|
| MD | <+/−0.05% |
| TD | <+/−0.05% |
| Flammability, UL94 | Passed VTM-0 |
| Electrochemical migration, 85° C./85% relative humidity/10 volts, with 3 mil line/space | Passed 1000 hrs |

Example 2

A cover film was made by coating the adhesive solution of Example 1 onto 12.5 micrometer thick Apical NP polyimide film and dried to remove the MEK solvent. The resulting dried adhesive film was 17 micrometers thick. The prepared coverfilm was laminated to the bright side of a 1 oz./ft² electrodeposited (ED) copper foil and cured in a hydraulic press for 60 minutes at a temperature of 175° C. The resulting material exhibited the properties shown in Table 3.

TABLE 3

Peel strength as made

| | |
|---|---|
| ½ oz. (Nikko black rolled copper foil | 9.4-10.1 pli |
| Bright side of 1 oz. ED copper foil | 5.7-7.8 pli |

Peel strength after 10 sec in 288° C. solder

| | |
|---|---|
| ½ oz. Nikko black rolled copper foil | 6.1-10.6 pli |
| Bright side of 1 oz ED copper foil | 7.2-10.6 pli |
| Solder float resistance in 288° C. solder | >10 min. without change |
| Adhesive flow (squeeze-out) | 25-75 micrometers |
| Flammability, UL94 | Passed VTM-0 |
| Electrochemical migration, 85° C./85% R.H./10 volts, with 3 mil line/space | Passed 1000 hrs. |

Use of the solid epoxy-nitrile rubber adduct results in an adhesive layer having the following features:
1. Low ion migration, no dendritic growth after 1000 hrs (85° C./85% R.H./−10 volts DC/3 mil conductor spacing), as well as after 240 hrs (85° C./85% relative humidity/50 volts DC/3 mil conductor spacing) (data not shown), and;
2. Better shelf life, theoretically because the carboxyl groups are pre-reacted in the adduct; and
3. Superior thermal stability for lead (Pb)-free solder processes.

Example 3 and Comparative Examples 1-4

The following results illustrate the improvement in thermal performance of the adhesives based on solid epoxy-nitrile rubber adducts when compared to adhesives that do not comprise the solid epoxy-nitrile rubber adducts.

Example 3 is an adhesive prepared according to the formulation in Example 1. Comparative Examples 1-4 are commercially available epoxy adhesive formulations used in flex circuits. Such adhesives normally comprise one or more epoxy resins and a high molecular weight carboxylated nitrile rubber (such as Nipol 1072), one or more flame retardants, other additives, and cure agents. Adhesives were cured for 90 minutes at 175° C.

Figure 4:
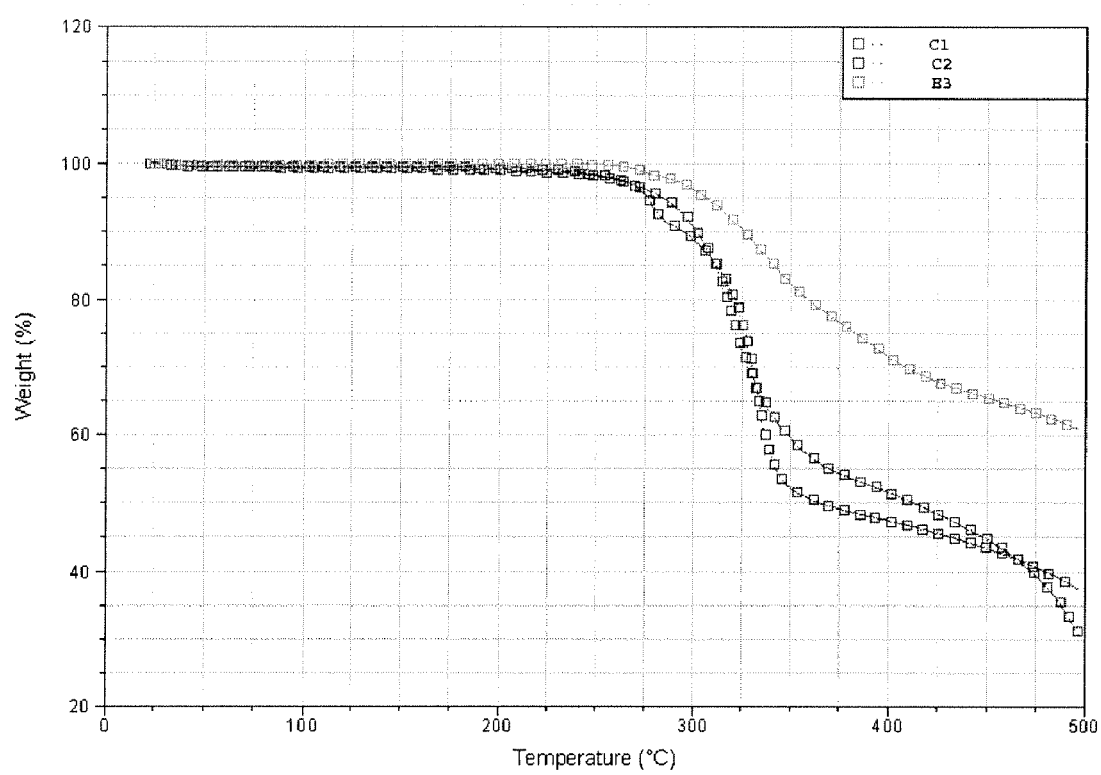
FIG. 4 is a graphical representation of the results of a TGA temperature sweep to 500° C.

Cured adhesive samples were subjected to thermogravimetric analysis, by heating from room temperature to 500° C. in air at a rate of 10° C. per minute, while measuring their weight loss. Results are shown in FIG. 4. Percent weigh loss is also shown in Table 4, as well as the failure time of double clad laminate samples (copper/adhesive/dielectric/adhesive/copper) comprising these adhesives after floating in solder at 288° C.

TABLE 4

| Ex. No. | Weight loss (%) at 500° C. | Exposure until degradation (minutes) at 288° C. |
|---|---|---|
| E3 | 40 | >10 |
| C1 | 63 | <2 |
| C2 | 70 | <2 |

With the two comparison adhesives, weight loss begins right at solder reflow temperature (240-260° C.). Volatiles generated during the solder reflow process lead to blisters and delamination of the circuit. Circuit fabricators, during material qualifications, usually require materials to survive solder exposure at 288° C. Diclad laminates (copper/adhesive/dielectric/adhesive/copper) made with DF-12-24 survive at least 10 minutes exposure to 288° C. solder. The same construction made with the two comparison adhesive fail in less than 2 minutes.

Peak temperatures during lead-free solder reflow process are generally in the range of 240-260° C. Another useful test to predict the ability of an adhesive to withstand solder reflow processes is to look at weight loss vs. time at 260° C. in air. In this test, the sample is taken quickly to 260° C. and then held at 260° C. for a period of time while measuring its weight. Less weight loss in this test is an indicator that the adhesive is more thermally stable at 260° C. and will be better able to survive the lead-free solder reflow conditions.

Figure 5:
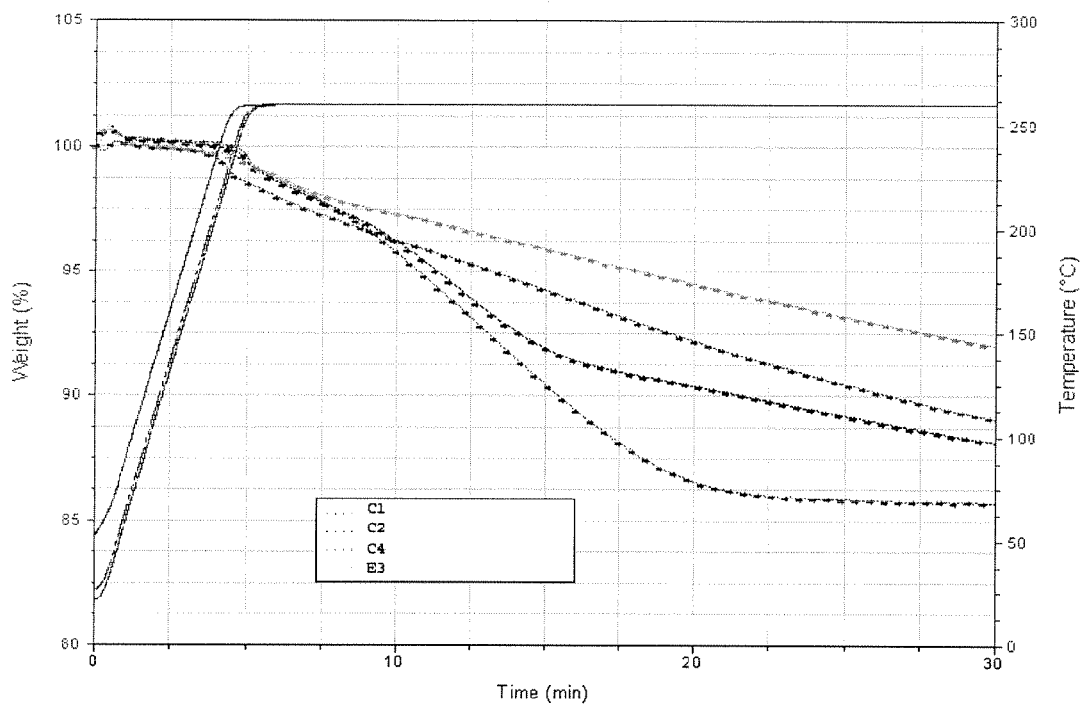
FIG. 5 is a graphical representation of the results of a TGA isotherm at 260° C.

Results from this test are shown in FIG. 5. Table 5 below lists the weight loss of the adhesive samples with time while standing at 260° C. in air.

TABLE 5

| Example No. | Weight loss (%) after standing at 260° C. for 15 minutes | Weight loss (%) after standing at 260° C. for 30 minutes |
|---|---|---|
| E3 | 4.25 | 7.5 |
| C1 | 6.5 | 10.5 |
| C2 | 8.5 | 12.5 |
| C3 | 9.5 | 14.5 |

It can be seen from the data in Tables 4 and 5 that Example 3 has superior thermal performance when compared to Comparative Examples 1-3. Example 3 can withstand 288° C. solder for a much longer time, and displays much less weight loss due to outgassing when taken to elevated temperatures.

Figure 6:
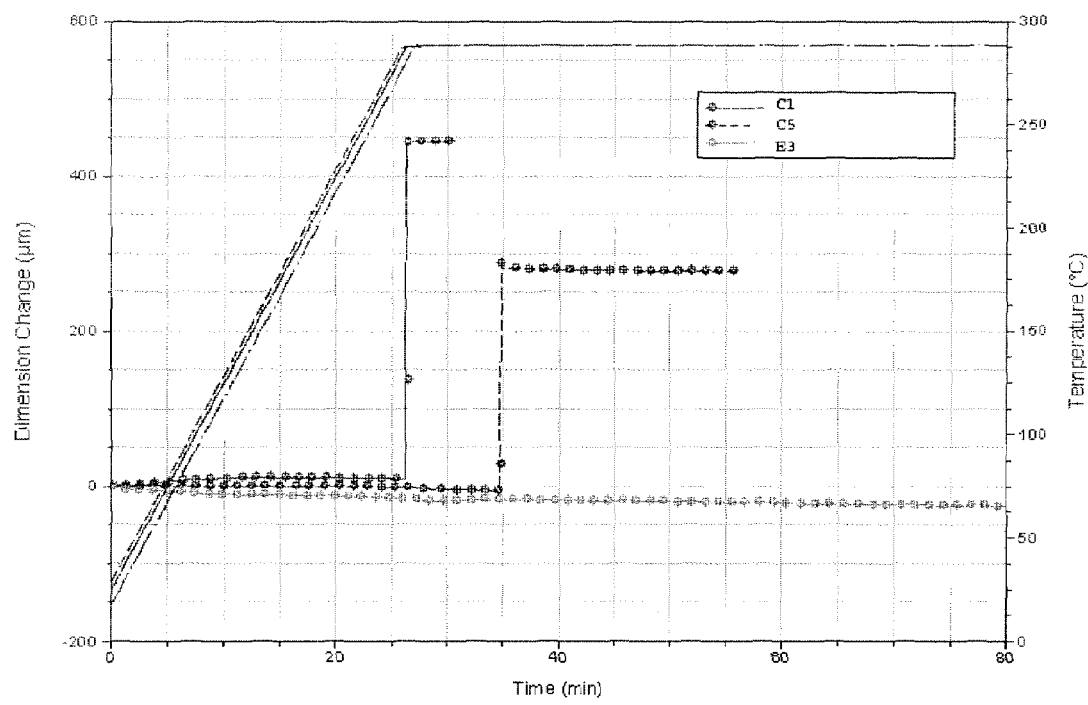
FIG. 6 is a graphical representation of the results of a TMA test illustrating dimensional change of a quartz probe.

In a further standard test used to illustrate temperature resistance of a material (a standard rigid board industry test), double clad laminate samples containing the adhesives of Example 3 and Comparative Examples 1 and 4 were placed in the furnace of the TMA equipment, and a quartz probe was placed on top of the specimen. The temperature was quickly increased to 288° C. and held there for an extended time. Failure in this test results when the quartz probe exhibits a rapid vertical displacement. This occurs when the sample delaminates or blisters. Results are shown in FIG. 6. Table 6 illustrates the time in minutes for each sample to fail.

TABLE 6

| Example No. | Time until failure (minutes) |
|---|---|
| E3 | >50 |
| C1 | <1 |
| C4 | about 14 |

The Figure and the above data shown that Example 3 is much more temperature resistant than comparative examples 1 and 4.

Examples 4-6 and Comparative Examples 1, 2, and 5

Table 7 lists the formulations used to manufacture Examples 4-6 and Comparative Example 7. All amounts are in parts by weight, based on the total weight of the composition. Methylon 75108 is a mixture of the allyl ethers of mono-, di-, and tri-methylol phenols (Durez Corporation)

TABLE 7

|  | E4 | E5 | E6 | C5 |
|---|---|---|---|---|
| HYPOX RK-84 | 60 | 80 | 100 | — |
| Nipol 1072 | 10 | — | — | 30 |
| DER 664 | — | — | — | 40 |
| DER 684-EK40 | 15 | 15 | 5 | — |
| Methylon 75108 | 5 | 5 | 5 | 5 |
| EPON 164 | 5 | 5 | 5 | 5 |
| Irganox 565 | 0.6 | 0.6 | 0.6 | 0.8 |
| Irganox 1010 | 0.3 | 0.3 | 0.3 | — |
| EXOLIT OP 935 | 20 | 20 | 20 | 20 |
| SIG 5840 | 0.1 | 0.1 | 0.1 | 0.08 |
| Dicyandiamide | 1 | 1 | 1 | 1.2 |
| 2-methylimidazole | 0.2 | 0.2 | 0.2 | 0.6 |
| Total solids | 117 | 127 | 137.2 | 103 |
| Properties |  |  |  |  |
| Film toughness | Good | Poor | Poor | Good |
| Peels (½ oz RA) (pli) | 7.5 | 5.7 | 6 | 10.9 |
| Tensile Strength (MPa) | 26 | 30 | 30 | 24 |
| Elongation (%) | 29 | 46 | 46 | 108 |
| Modulus (Mpa) | 904 | 953 | 1027 | 665 |
| Dendrite growth (After 85° C./85% R.H./50 V DC/120 hours) | No | No | No | Yes |

When exposed to a temperature of 85° C. at 85% relative humidity for 120 hours with a 50 volt bias and a 75 micrometer separation between conductors, Examples 4-6 did not grow copper dendrites between the conductors. In contrast, under the same conditions, dendritic growth was observed in Comparative Examples 1, 2, and 5.

Although high molecular weight NBR rubber (such as Nipol 1072) is not desired in the adhesive formulation for dendritic growth reasons, a small amount of this material does function to improve the B-staged adhesive film toughness. It has been observed that without a small amount of Nipol 1072, for example, B-staged coverfilm and free film products are brittle and may crack during handling in the circuit fabrication process. Use of a small amount (e.g., 1 to about 20, specifically about 5 to about 15 wt. %) does not appear to be a high enough concentration to significantly adversely affect dendritic growth performance. Where the manufacture of copper clad laminates does not require a tougher B-staged film, high molecular weight rubbers can be completely eliminated from the adhesive formulation.

Example 4 and Comparative Examples 1, 2, and 6-8

The following examples illustrate the flow properties of samples prepared using solid epoxy-NBR adducts. The formulation used to prepare comparative examples 11-13 is listed in Table 8. All amounts are in parts by weight, based on the total weight of the composition. Struktol PD 3610 is a liquid epoxy-NBR adduct.

TABLE 8

|  | E7 | C6 | C7 | C8 |
|---|---|---|---|---|
| Struktol PD 3610 | — | 60 | 50 | 40 |
| HYPOX RK-84 | 60 | — | — | — |
| Nipol 1072 | 10 | 10 | 10 | 10 |
| DER 684-EK40 | 15 | 5 | 15 | 20 |
| Methylon 75108 | 5 | 5 | 5 | 5 |
| EPON 164 | 5 | 5 | 5 | 5 |
| Irganox 565 | 0.6 | 0.6 | 0.3 | 0.6 |
| Irganox 1010 | 0.3 | 0.3 | 0.3 | 0.3 |
| EXOLIT OP 935 | 20 | 21 | 21 | 21 |
| SIG 5840 | 0.1 | 0.1 | 0.1 | 0.1 |
| Dicyandiamide | 1.0 | 1 | 1 | 1 |
| 2-methylimidazole | 0.2 | 0.2 | 0.2 | 0.2 |
| Total solid | 117 | 108.2 | 108.2 | 103.2 |

Table 8 lists the properties of Example 7 and Comparative examples 1-2, 5, and 6-8. UL VTM 0 indicates whether or not the samples passed the flame retardancy standard. Squeeze out/flow refers to whether or not squeeze out was observed. Tack, B-stage refers to whether or not the samples were tacky after being B-staged. Fill circuit traces refers to the ease of filling circuit traces using adhesives of corresponding formulations.

TABLE 9

|  | E7 | C1 | C2 | C5 | C6 | C7 | C8 |
|---|---|---|---|---|---|---|---|
| Peel strength (pli) | 7.5 | — | — | 10.9 | 7.5 | 7 | 5.4 |
| Tensile strength (MPa) | 26 | — | — | 24 | 16 | 22 | 15 |
| Elongation (%) | 29 | — | — | 108 | 47 | 34 | 22 |
| Modulus (MPa) | 904 | — | — | 665 | 400 | 567 | 486 |
| UL VTM 0 | yes | yes | yes | yes | yes | yes | yes |
| Squeeze-out/flow | medium | low | low | low | excess | excess | excess |
| Tack, B-stage | low | low | low | low | excess | excess | excess |
| Fill circuit traces | good | difficult | difficult | ok | good | good | good |

It can be seen from Table 9 that the formulation of Example 7, based on the solid epoxy-NBR adduct, exhibits balanced flow filling between fine features without excessive squeeze-out into pad areas. In particular, when comparing formulations based on solid epoxy NBR adduct (Example 7) with one based on liquid epoxy NBR adduct (Comparative Examples C5-C8), a disadvantage of the comparative examples was excessive flow and squeeze-out of the B-staged adhesive during the lamination of coverfilm and free film during circuit fabrication. Also, B-staged adhesives made with the liquid epoxy NBR were relatively soft and tacky and could not be easily handled. Tacky B-staged adhesives cannot be easily positioned during lay-up of circuit panels for preparation of lamination packages. In addition, tacky materials accumulate particulate contaminants during handling.

On the other hand, formulations based on the solid epoxy NBR adduct flowed less than those with the liquid epoxy adduct but more than formulations based on the high molecular weight carboxylated rubbers. Higher flow is an advantage when the coverfilm or free film adhesive must fill between very fine circuit features without voids with an acceptable level of squeeze-out. The new adhesives based on a solid adduct therefore exhibit a balanced flow, filling between fine features without excessive squeeze-out into pad areas. This higher flow is achieved without sacrificing the tack-free characteristics of the B-staged adhesive film.

Examples 5-7

Additional examples of adhesive compositions in accordance with the present invention are shown in Table 10, wherein amounts are amounts in parts by weight.

TABLE 10

|  | E5 Weight | E6 Weight | E7 Weight |
| --- | --- | --- | --- |
| Hypox RK84 | 60 | 60 | 40 |
| Nipol 1072 | 10 | 10 | 20 |
| Irganox 565 | 0.3 | 0.3 | 0.3 |
| Irganox 1010 | 0.15 | 0.15 | 0.15 |
| DER 664 | 5 | 5 | 10 |
| DER 684 | 15 | 15 | 15 |
| Methylon 75108 | 5 | | |
| Epon 164 | 5 | 5 | 5 |
| EXOLIT OP 935 | 19.20 | 18.20 | 17.30 |
| SIG 5840 | 0.10 | 0.10 | 0.10 |
| Dicyandiamide | 1.0 | 1.0 | 1.0 |
| 2-Methylimidazole | 0.2 | 0.2 | 0.2 |
| Total Solid | 121 | 115 | 109 |
| Properties | | | |
| Peels (1 oz Cu) (pli) | 9.7 | 9.7 | 5.1 |
| Peels After Solder (1 oz Cu) (pli) | 10.1 | 7.8 | 4.5 |
| Solder (288° C.)(min) | 10 | 10 | 10 |
| Squeeze out (mil/mil) | 3 | 3 | 2 |
| UL VTM 0 | Pass | Pass | Pass |
| Chemical Resistance (%) | >90 | >90 | >90 |
| Insulation Resistance (Ohm) (After 85° C./85% RH/50 V DC/144 hours) | 2.31E+11 | 8.54E+11 | 3.46E+11 |
| Tensile Strength (MPa) | 31 | 30 | 28.5 |
| Elongation at Break (%) | 59 | 58 | 75 |
| Tensile Modulus (Mpa) | 1042 | 573 | 804 |
| Tg (° C.) | 92 | 97 | 99 |

All of the adhesives of Examples 1-5 had advantageous properties for use in flex circuits, including build up layer applications.

The singular forms "a," "an," and "the" include plural referents unless the context clearly dictates otherwise. The endpoints of all ranges reciting the same characteristic or amount are independently combinable and inclusive of the recited endpoint. All references are incorporated herein by reference.

While specific embodiments have been shown and described, various modifications and substitutions can be made thereto without departing from the spirit and scope of the invention. Accordingly, it is to be understood that the present invention has been described by way of illustration and not limitations.

What is claimed is:

1. A circuit material, comprising an adhesive layer, wherein the adhesive layer comprises the reaction product of a blend comprising:
    a cure system; and
    an adduct, wherein a solid epoxy resin and a functional group-containing nitrile rubber, wherein the nitrile rubber is liquid, are pre-reacted to form the adduct prior to blending the adduct with the cure system and wherein greater than 75% of the functional groups in the functional group-containing nitrile rubber are reacted with the epoxy groups of the solid epoxy resin.

2. The circuit material of claim 1, further comprising a release film disposed on a side of the adhesive layer.

3. The circuit material of claim 2, further comprising a second release film disposed on a side of the adhesive layer opposite the first release film.

4. The circuit material of claim 1, further comprising a polymeric dielectric layer disposed on a side of the adhesive layer.

5. The circuit material of claim 1, further comprising a conductive layer disposed on a side of the adhesive layer.

6. The circuit material of claim 1, wherein the conductive layer is copper.

7. The circuit material of claim 1, wherein the functional groups in the functional group-containing nitrile rubber are carboxy groups.

8. The circuit material of claim 1, wherein the nitrile rubber has a low ionic content.

9. The circuit material of claim 1, wherein the nitrile rubber is manufactured using solution polymerization.

10. The circuit material of claim 1, wherein the blend is halogen-free.

11. The circuit material of claim 1, wherein the blend further comprises 1 to 20 parts by weight of a carboxy-functionalized nitrile rubber.

12. The circuit material of claim 10, wherein the blend further comprises alumina trihydrate and/or an aluminum phosphinate salt.

13. The circuit material of claim 1, wherein the blend is an adhesive composition consisting essentially of the adduct, or the adduct and an optional epoxy resin, with the remainder being flame retardants and other additives.

14. The circuit material of claim 1, wherein the blend further comprises an optional epoxy resin that is not in the adduct.

15. The circuit material of claim 1, comprising up to 20 parts by weight of the adduct.

16. The circuit material of claim 14, wherein the blend comprises 40 to 99 parts by weight of the adduct and 1 to 35 parts by weight of the optional epoxy resin that is not in the adduct.

17. The circuit material of claim 1, wherein the adhesive layer is B-staged.

18. A circuit material, comprising
    a polymeric dielectric layer;
    a first adhesive layer disposed on a first side of the dielectric layer; and
    a second adhesive layer disposed on a side of the dielectric layer opposite the first adhesive layer, wherein the first, second, or both adhesive layers comprise a halogen-free blend of, the blend comprising:
    a cure system; and
    an adduct, wherein a solid epoxy resin and a functional group-containing liquid nitrile rubber functionalized with epoxy-reactive carboxy groups are pre-reacted to form the adduct prior to blending the adduct with the cure system and wherein greater than 75% of the functional groups in the functional group-containing nitrile rubber are reacted with the epoxy groups of the solid epoxy resin.

19. The circuit material of claim 18, further comprising a first release film disposed on a side of the adhesive layer opposite the polymeric dielectric layer and a second release film disposed on a side of the second adhesive layer opposite the dielectric layer.

20. A circuit material, comprising
    a first and a second conductive layer;
    a polymeric dielectric layer; and
    a first and a second adhesive layer, wherein the first adhesive layer is disposed between the first conductive layer and a first side of the dielectric polymer layer, the second adhesive layer is disposed between the second conductive layer and a second side of the dielectric layer, and further wherein the first, second, or both adhesive layers comprise the reaction product of a blend comprising:

a cure system; and an adduct, wherein a solid epoxy resin and a functional group-containing nitrile rubber, wherein the nitrile rubber is liquid and functionalized with epoxy-reactive groups are pre-reacted to form the adduct prior to blending the adduct with the cure system and wherein greater than 75% of the functional groups in the functional group-containing nitrile rubber are reacted with the epoxy groups of the solid epoxy resin.

21. The circuit material of claim 20, wherein the polymeric dielectric layer comprises polyimide.

22. The circuit material of claim 20, wherein the adhesive layer is fully cured.

23. A circuit comprising the circuit material of claim 1.

24. A circuit comprising the circuit material of claim 18.

25. A circuit comprising the circuit material of claim 20.

26. A method of forming a circuit material, comprising disposing a layer of an adhesive material onto a conductive layer, a release layer, or a polymeric dielectric layer, wherein the adhesive material comprises a blend comprising:

a cure system; and an adduct, wherein a solid epoxy resin and a functional group-containing nitrile rubber, wherein the nitrile rubber is liquid and is functionalized with epoxy-reactive groups, are pre-reacted to form the adduct prior to blending the adduct with the cure system and wherein greater than 75% of the functional groups in the functional group-containing nitrile rubber are reacted with the epoxy groups of the solid epoxy resin.

27. The method of claim 26, further comprising partially curing the disposed adhesive material.

28. The method of claim 26, further comprising fully curing the disposed adhesive material.

* * * * *